US006859118B2

(12) United States Patent
Marquardt

(10) Patent No.: US 6,859,118 B2
(45) Date of Patent: Feb. 22, 2005

(54) SYSTEM AND METHOD FOR AN ULTRA LOW NOISE MICRO-WAVE COAXIAL RESONATOR OSCILLATOR USING ⅝THS WAVELENGTH RESONATOR

(75) Inventor: Gregory H. Marquardt, W. Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 1 day.

(21) Appl. No.: 10/334,786

(22) Filed: Jan. 2, 2003

(65) Prior Publication Data

US 2004/0130402 A1 Jul. 8, 2004

(51) Int. Cl.⁷ ............................................. H01P 3/06
(52) U.S. Cl. .................. 333/206; 333/222; 333/202; 331/101
(58) Field of Search ............................ 333/202, 206, 333/222; 331/101, 107 C

(56) References Cited

U.S. PATENT DOCUMENTS

| | | | | |
|---|---|---|---|---|
| 4,128,840 A | * | 12/1978 | Tucker | 343/715 |
| 5,168,253 A | * | 12/1992 | Nakagawa et al. | 333/189 |
| 5,216,394 A | * | 6/1993 | Konishi et al. | 333/222 |
| 5,300,895 A | * | 4/1994 | Jones | 330/251 |
| 5,495,215 A | | 2/1996 | Newell et al. | |
| 5,517,163 A | | 5/1996 | Sagawa et al. | |
| 5,714,913 A | | 2/1998 | Carlsten et al. | |
| 5,969,575 A | * | 10/1999 | Helms | 330/294 |
| 6,191,668 B1 | | 2/2001 | Takeuchi et al. | |
| 6,326,854 B1 | | 12/2001 | Nicholls et al. | |

* cited by examiner

Primary Examiner—Robert Pascal
Assistant Examiner—Joseph Chang
(74) Attorney, Agent, or Firm—Duane Morris LLP

(57) ABSTRACT

A system and method for a novel microwave coaxial resonator oscillator using a ⅝ths wavelength resonator is described. The novel system and method provides a coaxial resonator for operation at high frequencies comprising a conductive resonator and a coaxial conductive outer shell electrically connected by an conductive end member, wherein the conductive resonator and outer shell are of a length approximately equal to $(1/8+n/2)$ of the wavelength of the desired frequency, where n is a positive integer. The novel system and method provides a low noise oscillator for operation at high frequencies and reduces oscillator phase noise in high Q implementations.

The novel system and method also provides for reducing the aspect ratio of a 1/8 wavelength coaxial resonator by increasing in a stepwise manner the length of the coaxial resonator by n/2 wavelengths of the resonator frequency, where n is a positive integer. Furthermore, the novel system and method provides for reducing higher order modes in a 1/m wavelength coaxial resonator, operating at a high frequency, by increasing in a stepwise manner the length of the 1/m wavelength coaxial resonator by n/2 wavelengths of the resonator frequency, where n and m are positive integers.

43 Claims, 2 Drawing Sheets

SYSTEM AND METHOD FOR AN ULTRA LOW NOISE MICRO-WAVE COAXIAL RESONATOR OSCILLATOR USING ⅝THS WAVELENGTH RESONATOR

BACKGROUND OF THE INVENTION

In recent years, there is an increasing need for compact and lightweight equipment in the field of radio communication such as portable telephones. In filter devices commonly built in present day portable radio communication devices, coaxial resonators using dielectric materials assuring a high dielectric constant with low loss, are widely utilized. The reduction in size for such coaxial resonators is usually accomplished by using dielectric materials having a high dielectric constant or modifying the shape of a resonator body so as to change the characteristic impedance of a line in a stepwise fashion.

Similarly, oscillators are required within many different technology areas, especially within the expanding communication industry. In communication applications, oscillators are commonly used to generate carrier signals at specific frequencies on which information signals are subsequently modulated.

There are a number of advantages of using a coaxial resonator to stabilize a Voltage Controlled Coaxial Resonator Oscillator (VC-CRO) within a frequency stable phase locked loop (PLL-FS). These advantages relate to the physical design of a coaxial resonator. Typically, a ceramic coaxial resonator comprises a dielectric material formed as a rectangular prism with a coaxial hole running lengthwise through the prism and a electrical connector connected to one end. The outer and inner surfaces of the prism, with the exception of the end connected to the electrical connector and possibly the opposite end, are coated in a metal such as copper or silver. A device formed in this manner essentially forms a resonant RF circuit, including capacitance, inductance, and resistance, that oscillates when in the Transverse Electromagnetic (TEM) mode. The advantages gained with this design include a high Q value and therefore low noise oscillations associated with the resonator as well as temperature stability and resistance to microphonics that characterize coaxial resonators especially those made of ceramic. These high Q values are necessary in High Q applications requiring a Q value of greater than 300. These advantages result in a further important advantage, that being a low cost.

Unfortunately, there is a significant problem with the use of coaxial resonators as currently designed. The frequency of resonance for coaxial resonator has a maximum frequency that can be output due to physical limitations. The frequency of resonance for a coaxial resonator is based upon the physical size and shape of the particular resonator. Coaxial resonators, for a desired reactance, with low loss and low impedance, both desirable for high Q, approach a square geometry at high frequencies, above approximately 3 GHz which induces resonance at undesirable modes due to the low aspect ratio. This is a physical limit that, as currently designed, limits the output of a typical Coaxial Resonator Oscillator (CRO) using a coaxial resonator to approximately an upper range of 3 GHz, whether the CRO is voltage controlled or not. Although some have claimed ceramic coaxial resonators can be pushed up to 5 GHz, their functionality is significantly reduced, rending them undesirable for many applications.

Up until recently, this 3 GHz limit has not significantly affected the use of coaxial resonators within VC-CROs or CROs since the frequency of operation of previous communication equipment was typically below 3 GHz. For example, PCS equipment operate at approximately 1900 MHz. Currently there are a number of different communication standards that require VCOs with oscillation frequencies higher than 3 GHz. For instance, OC-192 fiber optic signals are transmitted at approximately 10 GHz and the newly developed Local Multipoint Distribution System (LMDS), slated to be used for the Internet over wireless links, is set to operate between 28 to 30 GHz. It can be assumed that further developments and standards will be designed that requires yet higher oscillation frequencies.

One well-known technique to increase the oscillation frequency of signals within a system using a standard VCO is to use a subharmonically pumped mixer that doubles the oscillation frequency at a stage after the VCO. Unfortunately, even with the use of a subharmonically pumped mixer, a system using the standard VCO that operates with a coaxial resonator is still limited to a maximum oscillation frequency of 6 GHz which is insufficient for LMDS applications. Hence, techniques are required to increase the oscillation frequency within the actual VCOs.

One technique that has been tried to increase the oscillation frequency output from a PLL-FS as beyond the 3 GHz limit is to add a frequency multiplication stage after the amplifier. A frequency multiplier is coupled to the output of an amplifier and further coupled in series with a first filter, an amplifier, and a second filter. In this design, the multiplier increases the oscillation frequency of the signal by three times that of the frequency output from the amplifier. Hence, if the original frequency of the VCO was 3 GHz, this would allow the resulting system frequency (after using a subharmonically pumped mixer) to be 9 GHz. The filters and amplifier are used to reduce the noise spurs and other undesirable characteristics added to the signal as a result of the multiplier. One problem with this implementation is the inability of the filters and amplifier to completely remove the spurs and undesired mixing products output from the multiplier, hence passing on these non-ideal characteristics to further components within the system that use the oscillating signal. Another problem is the typically low efficiency of multipliers, that can lead to high current consumption within the circuit by the multiplier. Yet further, the added components also add to the component count and cost for the overall PLL-FS.

Another technique that is used to increase the oscillation frequency being output from a VCO is to replace the standard VC-CRO with an oscillator stabilized with an alternative resonator device to the coaxial resonator. In one implementation, this alternate oscillator is a Dielectric Resonator Oscillator (DRO) which can allow for frequencies higher than 20 GHz to be output. A DRO typically uses a Colpitts oscillator while using a dielectric resonator in place of the coaxial resonator. Dielectric resonators consist of a puck of dielectric material encased within a cavity. The physical dimensions of the puck set the frequency range for a DRO while the placement of the puck within the cavity is critical to the tuning of the center frequency. One of the key disadvantages of the DRO implementation is the cost of tuning the center frequency. Since the puck of a DRO is sensitive with respect to its location within the cavity, the DRO as a whole is susceptible to microphonics, that being mechanical vibration of the resonator housing the possible problems associated with microphonics and frequency centering adds considerable manufacturing costs to a DRO as specially engineered casings are required.

Another alternative implementation for the VCO is to replace the VC-CRO stabilized with a ceramic coaxial resonator with a Yttrium Iron Garnet (YIG) stabilized oscillator. These oscillators can operate at sufficiently high frequencies with low noise throughout the tuning bandwidth. Unfortunately, there are a number of unacceptable disadvantages to their use. For one, the tuning of these YIG devices is relatively slow (300 KHz modulation bandwidth versus a typical 2 MHz modulation bandwidth for a VC-CRO) due to the use of an inductor within the tuning circuit. Other disadvantages include the high current consumption of these oscillators and their relatively high cost when compared to the VC-CRO.

The advantages of using a coaxial resonator to stabilize an oscillator within a PLL frequency synthesizer are especially apparent when compared to the alternative designs discussed above. The simple design of a coaxial resonator is not sensitive to microphonics as there are no placement or cavity requirement, unlike the dielectric resonator implementation. Further, the tuning of a VC-CRO is sufficiently fast to be used within a variety of applications, unlike the tuning of a YIG stabilized oscillator. A key advantage, as a result of the other advantages, is the high performance quality with a low cost. The disadvantage is, as discussed previously, the physical limitation of a ceramic resonator that further causes a limitation to the achievable oscillation frequency. Hence, an alternative implementation for an oscillator is required that can satisfy high oscillation frequency requirements while maintaining the advantages gained with the use of coaxial resonators.

Accordingly, it is an object of the present invention to obviate many of the above problems in the prior art and to provide a novel Coaxial resonator for operation at high frequencies comprising a conductive resonator and a coaxial conductive outer shell electrically connected by an conductive end member, wherein the conductive resonator and outer shell are of a length approximately equal to (1/8+n/2) of the wavelength of the desired frequency, where n is a positive integer.

It is another object of the present invention to provide a novel system and method a low noise oscillator for operation at high frequencies comprising a coaxial resonator, wherein the coaxial resonator is a (1/8+n/2) of wavelength resonator, where n is a positive integer.

It is yet another object of the present invention to provide a novel system and method of reducing Oscillator phase noise in high Q implementations, the improvement of using a (1/8+n/2) wavelength coaxial resonator, resonating at a high frequency, as the resonator, where n is a positive integer.

It is still another object of the present invention to provide a novel method for reducing the aspect ratio of a 1/8 wavelength coaxial resonator comprising increasing in a stepwise manner the length of the coaxial resonator by n/2 wavelengths of the resonator frequency, where n is a positive integer.

It is an additional object of the present invention to provide a novel method of reducing higher order modes in a 1/m wavelength coaxial resonator, operating at a high frequency, by increasing in a stepwise manner the length of the 1/m wavelength coaxial resonator by n/2 wavelengths of the resonator frequency, where n and m are positive integers.

These and many other objects and advantages of the present invention will be readily apparent to one skilled in the art to which the invention pertains from a perusal of the claims, the appended drawings, and the following detailed description of the preferred embodiments.

DETAILED DESCRIPTION

Figure 2A:
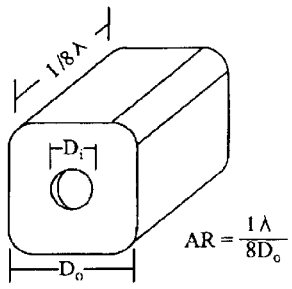
FIG. 2a is a prior art ceramic 1/8 wavelength coaxial resonator.
Figure 2B:
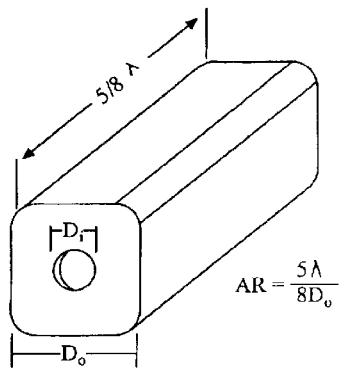
FIG. 2b is a ceramic 5/8 wavelength coaxial resonator according to an embodiment of the present invention.

The dielectric coaxial resonator 100 generally includes a hollow cylindrical dielectric substance 11, an inner, or central conductive member 14, and an outer conductive member 15. The central conductive member 14 continues from the outer conductive member 15 at an end of the resonator 100 to form a short-circuit end 50, while it is isolated from the outer conductive member 15 at the opposite end of the resonator 100 to form an open end. In addition, the dielectric substance 11 is geometrically oriented to define cylindrical through hole 12 which is, as clearly shown in the drawings, arranged coaxially with the dielectric substance 11. The dielectric substance is preferable, but not limited to, a ceramic material. The through hole 12 so extends from the short-circuit end 50 as to have the length $L_{in}$. The outer conductive member 15 has a length $L_{out}$. The values for $L_{in}$ and $L_{out}$ can be substantially the same or $L_{in}$ can be appropriately smaller. The length is governed by the wavelength of the frequency desired by the function (1/m+n/2) where m and n are positive integers, m representing the denominator of a fractional wavelength resonator and n representing the number of 1/2 wavelengths added to the resonator as taught in the present invention. In FIG. 2b for the 5/8 wavelength coaxial resonator m=8 and n=1, accordingly in implementing the invention for a high frequency 1/4 wavelength coaxial resonator m=4 and n can be 2 resulting in a 1 1/4 wavelength coaxial resonator.

The length for a 29 GHz desired frequency for a 5/8 resonator, the length $L_{in}$ and $L_{out}$ are approximately equal to:

$$L = \frac{5}{8} \cdot \frac{1}{f} \cdot c\left[\frac{m}{s}\right] = \frac{5}{8} \cdot \frac{1}{29 \times 10^9 \text{ Hz}} \cdot 2.998 \times 10^8 = .64 \text{ mm}$$

Figure 1:
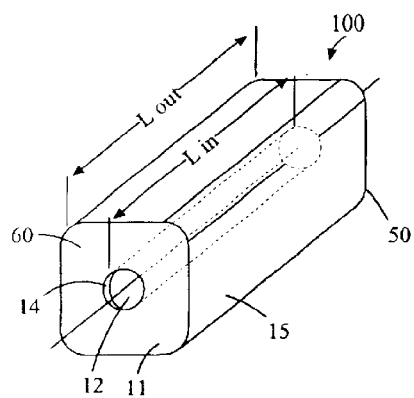
FIG. 1 is a ceramic (1/8+n/2) wavelength coaxial resonator according to an embodiment of the present invention.

In the preferred embodiment, as shown in FIG. 1, the length of the coaxial resonator is expanded from 1/8 wavelengths to a n/2 wavelengths in order to preserve the aspect ratio. In FIGS. 2a and 2b a 1/8 wavelength coaxial resonator is shown in comparison to a 5/8 wavelength coaxial resonator. In order to achieve the desired characteristics of the coaxial resonator the diameter of the inner conductor 14 must be a predetermined ratio of the diameter of the outer conductor 15, the ratio being a function of the dielectric constant among other factors. As the resonance frequency increases the coaxial resonator approaches a square like shape which allows higher order modes to resonate, this square like shape is reflected as an aspect ratio which approaches unity. As is known in the art, the aspect ratio (AR) is a ratio of the length to the width of the coaxial resonator. In FIG. 2b, a preferred embodiment of the present invention is shown. The coaxial resonator has the same outer conductor diameter and the same inner conductor diameter thus retaining the same dielectric constant and Q factor as the 1/8 length coaxial resonator in FIG. 2a, but with an aspect ratio 5 times greater. This increased AR prevents the higher order modes from resonating.

Figure 3:
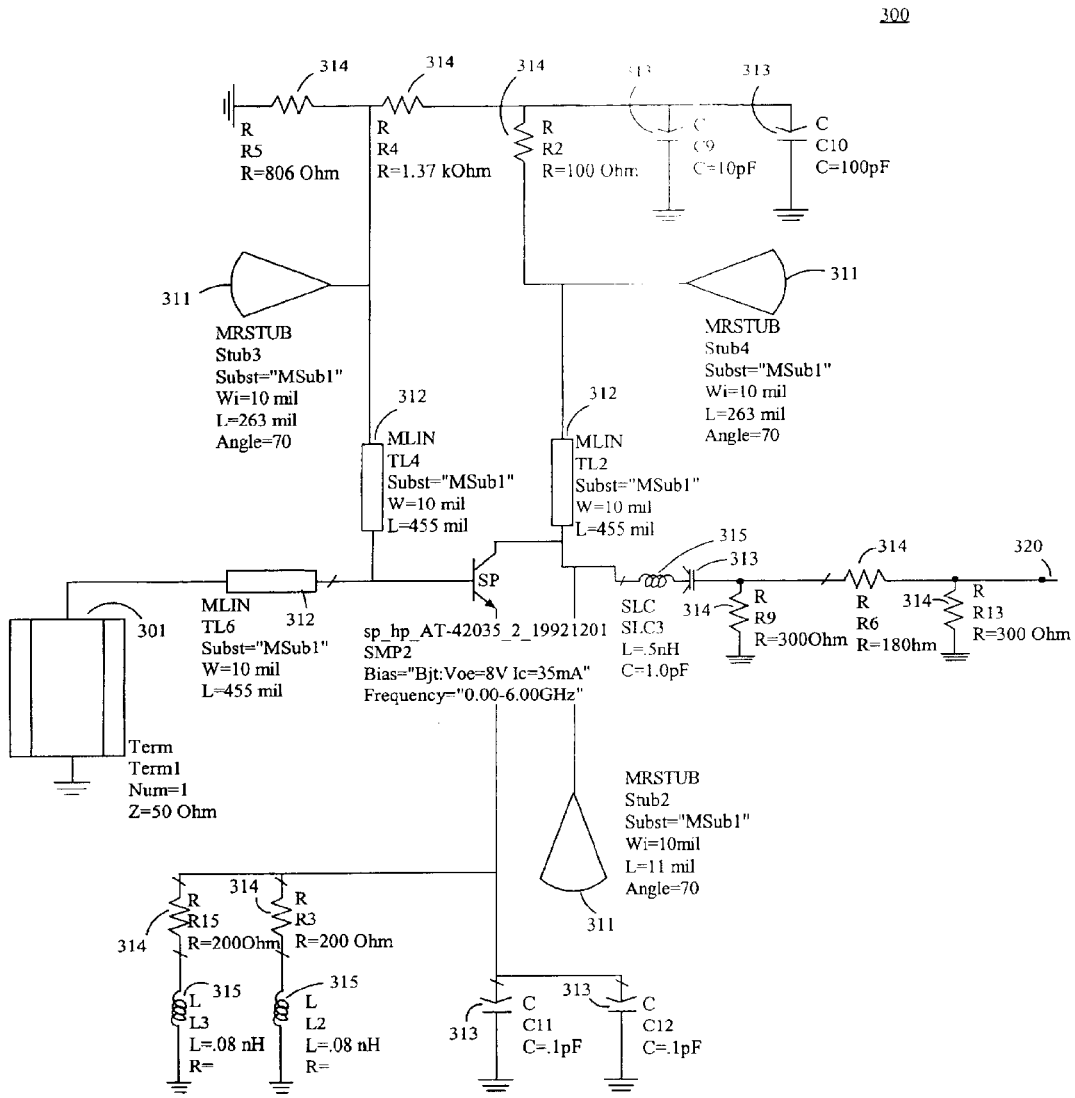
FIG. 3 is an ultra low noise oscillator with a (1/m+n/2) wavelength coaxial resonator according to an embodiment of the present invention.

FIG. 3 is a schematic of an ultra low noise oscillator 300 with a (1/m+n/2) wavelength coaxial resonator 301. The (1/m+n/2) wavelength coaxial resonator 301 is connected between the oscillator circuit and ground. The oscillator circuit 310 contains radial studs 311, inductance components 312, capacitors 313, resistors 314 and inductors 315 arranged as known in the art to provide a signal at the desired frequency at the output 320. A typical oscillator circuit 310 as shown in FIG. 3, includes arrangements to remove DC and circuit bias from the output frequency signal. The (1/m+n/2) wavelength coaxial resonator 301 also can include tuning circuits (not shown) as are well known in the art to adjust or tune the resonator. These tuning circuits typically include variable capacitance components.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

I claim:

1. A coaxial resonator for operation at a predetermined high frequencies comprising; a substantially conductive inner member and a substantially conductive outer member electrical connected by an conductive end member, wherein the conductive inner member and outer member are coaxial and are of a length approximately equal to (1/8+n/2) of the wavelength of the predetermined high frequency, wherein n is a positive integer.

2. The coaxial resonator according to claim 1, wherein n=1.

3. The coaxial resonator according to claim 1, wherein a dielectric material is located between the inner member and the outer member.

4. The coaxial resonator according to claim 3, wherein the dielectric material is a ceramic material.

5. The coaxial resonator according to claim 1, wherein the high frequency is greater than 3 GHz.

6. The coaxial resonator according to claim 1, wherein the high frequency is greater than 5 GHz.

7. The coaxial resonator according to claim 1, wherein the high frequency range is between 3 GHz and 5 GHz.

8. The coaxial resonator according to claim 1, wherein the high frequency range is between 20 GHz and 30 GHz.

9. The coaxial resonator according to claim 1, wherein the high frequency is 30 GHz or greater.

10. A Low Noise oscillator for operation at high frequencies comprising a coaxial resonator, wherein the coaxial resonator is a (1/8+n/2)$\lambda$ wavelength resonator, wherein n is a positive integer and $\lambda$ is the operating wavelength.

11. The low noise oscillator according to claim 10, wherein n=1.

12. The low noise oscillator according to claim 10, wherein a dielectric material is located between the inner member and the outer member.

13. The low noise oscillator according to claim 12, wherein the dielectric material is a ceramic material.

14. The low noise oscillator according to claim 10, wherein the high frequency is greater than 3 GHz.

15. The low noise oscillator according to claim 10, wherein the high frequency is greater than 5 GHz.

16. The low noise oscillator according to claim 10, wherein the high frequency range is between 3 GHz and 5 GHz.

17. The low noise oscillator according to claim 10, wherein the high frequency range is between 20 GHz and 30 GHz.

18. The low noise oscillator according to claim 10, wherein the high frequency is 30 GHz or greater.

19. The low noise oscillator according to claim 10, wherein the high frequency range is 5 GHz or greater.

20. In a method of reducing Oscillator phase noise in high Q implementations, the improvement of using a (1/8+n/2)$\lambda$ wavelength coaxial resonator, resonating at a high frequency, as the resonator, wherein n is a positive integer and $\lambda$ is the high frequency wavelength.

21. The method according to claim 20, wherein n=1.

22. The method according to claim 20, wherein the high frequency is greater than 3 GHz.

23. The method according to claim 20, wherein the high frequency is greater than 5 GHz.

24. The method according to claim 20, wherein the high frequency range is between 3 GHz and 5 GHz.

25. The method according to claim 20, wherein the high frequency range is between 20 GHz and 30 GHz.

26. The method according to claim 20, wherein the high frequency is 30 GHz or greater.

27. The method according to claim 20, wherein the high frequency range is 5 GHz or greater.

28. A method of increasing the aspect ratio of a 1/8 wavelength coaxial resonator, resonating at a high frequency comprising the step of increasing the length of the coaxial resonator by n/2 wavelengths of the resonator frequency, where n is a positive integer.

29. The method according to claim 28, wherein n=1.

30. The method according to claim 28, wherein the high frequency is greater than 3 GHz.

31. The method according to claim 28, wherein the high frequency is greater than 5 GHz.

32. The method according to claim 28, wherein the high frequency range is between 3 GHz and 5 GHz.

33. The method according to claim 28, wherein the high frequency range is between 20 GHz and 30 GHz.

34. The method according to claim 28, wherein the high frequency is 30 GHz or greater.

35. The method according to claim 28, wherein the high frequency range is 5 GHz or greater.

36. In a method for reducing higher order resonance modes in a 1/m wavelength oscillator, operating at a high frequency, the improvement comprising increasing the length of the 1/m wavelength coaxial resonator by n/2 wavelengths of the resonator frequency, where n and m are positive integers.

37. The method according to claim 36, wherein n=1.

38. The method according to claim 36, wherein the high frequency is greater than 3 GHz.

39. The method according to claim 36, wherein the high frequency is greater than 5 GHz.

40. The method according to claim 36, wherein the high frequency range is between 3 GHz and 5 GHz.

41. The method according to claim 36, wherein the high frequency range is between 20 GHz and 30 GHz.

42. The method according to claim 36, wherein the high frequency is 30 GHz or greater.

43. The method according to claim 36, wherein the high frequency range is 5 GHz or greater.

* * * * *